April 16, 1963 S. OSTROW 3,086,132

PIEZOELECTRIC MOUNTING AND DEVICE

Original Filed Aug. 30, 1960 2 Sheets-Sheet 1

INVENTOR

Stanley Ostrow,

BY [signature]

ATTORNEY

PIEZOELECTRIC MOUNTING AND DEVICE

Original Filed Aug. 30, 1960 2 Sheets-Sheet 2

INVENTOR
Stanley Ostrow,

BY [signature]
ATTORNEY

United States Patent Office 3,086,132

Patented Apr. 16, 1963

3,086,132

PIEZOELECTRIC MOUNTING AND DEVICE

Stanley Ostrow, Silver Spring, Md., assignor, by mesne assignments, to Sensonics, Inc., Washington, D.C., a corporation of Delaware Original application Aug. 30, 1960, Ser. No. 52,492. Divided and this application Aug. 14, 1961, Ser. No. 131,255

7 Claims. (Cl. 310—9.1)

My invention relates to a piezoelectric crystal mount which supports the crystal pressure responsively between electrical connectors under preadjusted pressure. More practically, my crystal mount supports the crystal pressure responsively with an electrical lead contact in the preadjusted pressure sensitive relationship with one side of the crystal, an opposite side being mounted exposed and sensitive of pressure variations of various types. This preadjusted pressure sensitive mounting of my piezo crystal is useful in several systems to measure pressure variations electrically and accordingly, it can be mounted to measure the pressure of such systems or other variables of a system which can be measured in terms of pressure. My invention further relates, therefore, to combinations of my crystal mount with such systems to measure and sometimes to control the conditions thereof.
the conditions thereof.

In prior mountings of a piezo crystal, the electrical contact with the crystal was either a mechanical or solder junction and the wire body and contact were free to mechanically vibrate at or near the juncture with the crystal which in itself was a large source of inaccuracy since the output of the crystal is very sensitively responsive to the vibrations which vary the pressure thereon and any vibration particularly of the contacts and lead wires to the crystal is a variable, which the present invention overcomes.

The problem of adequate mounting for accurate use of a piezo crystal is overcome in the present invention by securing the crystal in a housing which leaves one face of the crystal pressure sensitively exposed to ambient or other variable pressure systems including other physical forces converted to pressures and applied to this crystal for measurement, by use of the present crystal mounting. An opposite surface of said crystal has an electrical contact mechanically held thereagainst under a torque applied pressure, threaded support. The threaded support for the contact is of non-conductive or insulated material and adjustably urges the electrical contact against said opposite crystal face. The housing itself in pressure contact with the crystal has another permanent electrical lead or may be mounted in grounding contact with the system.

With such mount, one face of the crystal remains pressure sensitively exposed and the other face has an electrical connector pressed thereagainst in a very accurately controlled pressure. Thereby, both connections to the crystal are in themselves insensitive to pressure, the crystal itself has one face held exposed very highly sensitive to pressure, and the crystal further is held under a preadjusted pressure against its electrical contacts. With such mount the crystal had one face very highly sensitized to any desired electrical output and by pressure applied to the exposed face, after controllably presetting the crystal pressure against the electrical contact in its mount.

Such controlled sensitive mounting allows the crystal to be used for numerous applications for which it was not heretofore available, or not accurately so. For instance, a crystal, so mounted, by assembling with the pressure sensitive surface exposed to the ambient air will usefully record that pressure as it may vary; or where the carrier body, or the air in contact with the crystal is moving at high velocity relatively to each other may have the pressure variation on the crystal and its consequent current output calibrated in terms of velocity or pressure, thus to provide a useful speedometer when mounted in the nose or skin of any moving body, for instance, an antomobile, a missile, plane, or the like. In like matter, the pressure variations on the sensitive surface varying the electrical output on the crystal may be used to measure relatively static pressures as in a pressure gauge, temperature, or weight, or regularity of even other measurements such as linear dimensions, as in a distance gauge; or the electrical output itself can be used as a source of electrical energy to operate fine instruments, to standardize other sources of current, or to operate a time piece or the like.

The invention is further explained by reference to the drawings in which

Figure 1:
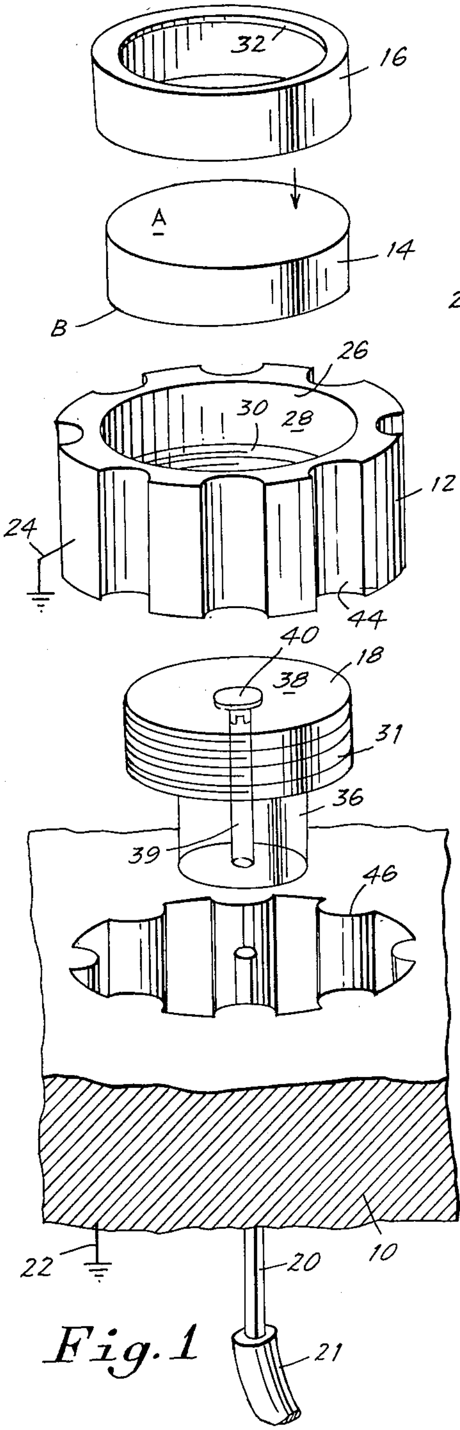
FIG. 1 shows the several disassembled parts of the crystal and mount including a holder such as the skin of a vehicle or missile in which it would be supported, the several parts being arranged in the order in which they would be assembled.

Referring to FIG. 1, the several parts illustrated comprise a supporting body 10 and a crystal receptor or housing 12, a piezo crystal 14, a supporting bushing 16, a torque adjustable non-conductive contact support 18 and an electrical lead wire 20 from which may be stripped some of the insulation 21. The supporting body 10 may be a metal in which case it may be grounded at 22, or if it was not of metal then a grounding lead 24 would need to be attached to the crystal receptor housing 12 to complete the ground circuit.

Figure 3:
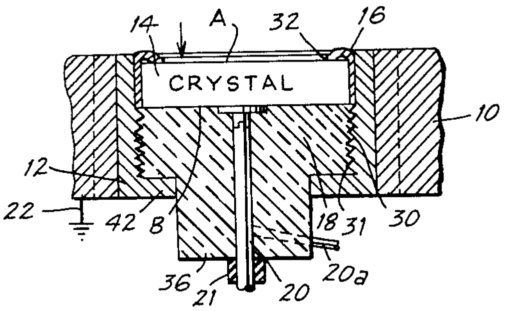
FIG. 3 is an elevation in section through about the center of the assembly taken on the line of about 3—3 of FIG. 2.

The crystal receptor housing 12 is made of conductive or semi-conductive material and is centrally bored at 26 to a smooth upper half surface 28 and a threaded lower half 30. The bushing 16 has an upper flange of lip 32, turned down as shown in FIG. 3, to have a downwardly projecting angular sharp corner. The internal diameter of the ring 16 is sized to silidingly receive the piezo crystal 14 with it upper surface A exposed through the top opening in the ring 16. The outer diameter of the ring 16 is sized to be tightly press-fitted into the annular smooth portion 28 of the bore 26. Thus the bushing 16 is press-fitted in the receptor housing 12, and the crystal 14 is slidingly fitted therein as shown in FIGS. 2 and 3 with its top surface A exposed and with upper edges held by the upper flange 32.

The contact support 18 is formed of non-conductive material such as hard insulating plastic, and has its outer cylindrical surface 31 threaded to mate with the threads 30 in the lower half of the housing 12. The lower portion of the support 18 continues downward in a projecting boss 36 of smaller diameter than the surface 31 and projects below the mount 12 in assembled position as shown in FIGS. 2 and 3, for purposes which will appear. The central portion of the contact support 18, is axially bored at 39 and has a metal contact member 40 tightly flush fitted in the top surface 38 in the end of the bore 39. A contact lead wire 20 passes upward through closely held in the bore 39, and is tightly secured as by soldering or by set screw (not shown) to the lead contact 40. In this manner the lead 20 and the contact 40 are tightly fitted into the top surface of the non-conductive contact support 18 as to be substantially integral therewith, but can be adjustably rotated by adjusting the screw thread positions 30 and 31 relative to each other, that is, by rotating the projecting boss. Such rotation adjusts the pressure of the contact 40 against the underside of the crystal 14.

It is not essential, but useful, to have the bottom opening of the mount 12 partially closed by a flange 42 which acts as a stop for the threads 30—31 and the lower position of the contact member 18. It is also useful to have the outer annular surface of the housing 12 cut with one or several ribs, splines, or keyways 44 which allows the assembled crystal to be inserted and securely held in use by some supporting body 10 which is correspondingly keyed, ribbed or splined at 46 to easily receive the mounted crystal securely fixed therein for immediate use or removal.

Figure 2:
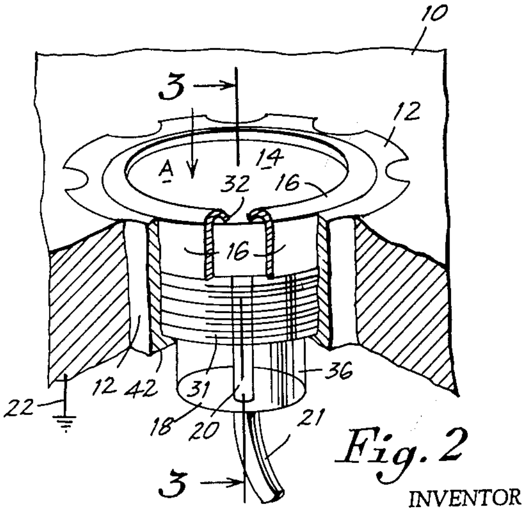
FIG. 2 is a perspective of the assembly with parts broken away and in section to illustrate some internal construction.

In assembling the crystal and its mounting element in a unit such as shown in FIGS. 2 and 3, as described, the contact support member 18 with the contact 40 and wire 20 secured therein, is first assembled into the mount 12 by rotating the threaded portions so that the support 18 is at the lowermost position against the flange 42. The crystal is then inserted into the bushing 16 and the bushing is then press-fitted into the housing 12, close to, but allowing a small clearance between the lower crystal surface B and the top 38 of the contact support 18. Thereafter, the projecting boss 36 is slowly rotatably adjusted, turning the threads 31 with respect to the mating threads 30 of the housing, thereby adjusting the pressure of the contact holder 18 and the contact 40 against the bottom surface B of the crystal 14, and in turn pressing the entire crystal against the contact lip 32 of the ring 16 to a very exact and calibrated contact pressure and consequent electrical output characteristic.

In this matter it will be seen that the crystal is secured under pressure, a rotary torque applied by a new thread adjustment of threads 30 and 31 between the contact 40 bearing against its lower surface and the downturned shoulder or lip portion 32 bearing electroconductively against a small annular margin of the top crystal surface A with most of the upper surface A remaining exposed to ambient pressure. Thus, by rotating the projecting portion 36 of the contact holder, the pressure between the surfaces A and B or the crystal is exactly adjusted and the crystal 14 is securely retained firmly between electroconductive contacts. Moreover, by emplacing the entire contact mount in a splined or keyed holder 10, it is emplaced for immediate use ready to supply its calibrated electrical output with exact variation responsive to any pressure variation upon the crystal applied to its exposed surface A in the direction of the arrow.

Figure 4:
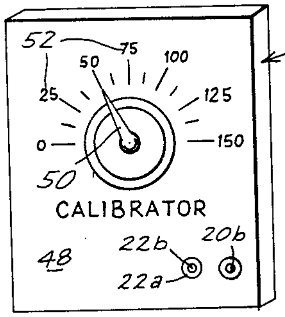
FIG. 4 illustrates a device using the crystal for calibrating.

Such mount has numerous uses. It will be understood as known to one skilled in the art that the electrical output of a piezo crystal varies according to the pressure upon the crystal. The pressure is first applied and adjusted upon crystal 14, with the torque rotation of the contact holder 18 which forces contact 40 against the under side of the crystal increasing its pressure upon the crystal as it is rotated clockwise. For instance, as the boss 36 is grasped and rotated, rotating mating threads 31 within threads 30, the face 38 of the holder and its contact 40 is forced against the underside of crystal 14 with progressingly increasing pressure as it is rotated. If the crystal 14 of FIG. 3, accordingly, is mounted in a holder 10*a*, as shown in FIG. 4, with the boss portion 36 extending and projecting through the plane of the face 48, any clockwise rotation of that boss will, by increasing the pressure on the crystal increase its voltage and/or current output. Conversely, if the boss 36 is rotated counterclockwise, the current output is decreased. A dial position indicator arm 50 may be mounted to the end of the boss 36 as shown. The face 48 of the holder may have marking 52 thereon comprising a dial face. These markings may be positioned and adjusted after suitable calibration to be read in terms of voltage output with variations of pressure on the crystal 14 inasmuch as that pressure will vary with the radial torque position of the indicator 50, with suitable calibration. The indicator 50 will be set in such calibration to accurately point to a dial position indicative of the voltage output of the crystal 14. The lead wire 20 can be taken off through a side of the boss 36 as shown in dotted line position 20*a* of FIG. 3 for purposes of leading wires behind the face 48 of the holder 10*a*. The lead wire 20, however, could also pass directly through the axis of rotation of indicator 50. The lead wire 20, not shown in FIG. 4, is connected to an insulated binding post 20*b* as an output terminal for the crystal. An input terminal, which may be merely a similar binding post 22*b*, is preferably provided in the same area for purposes of making contact with the housing 12 through a lead wire 24. If the holder material 10*a* is conductive, then the binding post 22*b* may be merely a grounding contact 22*a*. After calibration of the dial settings 52 and indicator arm 50 with respect to the crystal mount position in the holder 10*a*, the entire device is useful as a meter for standardizing or calibrating other electrical devices because its electrical output across terminal 20*b* and 22*b* is readable from the dial position of pointer arm 50. It is a useful laboratory tool for measuring the electrical conditions of other electrical units. Accordingly, the device shown in FIG. 4, as described, is useful as a standardized electrical output element variable according to its dial setting to a desired electrical output.

Figure 5:
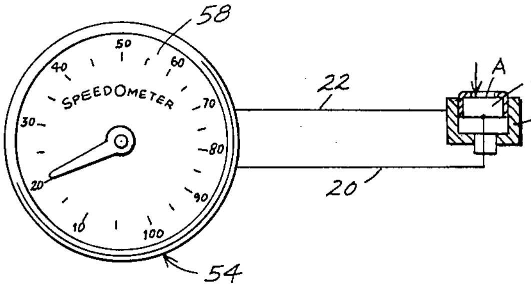
FIG. 5 is a diagram illustrating the use of the crystal combined with a speedometer.

FIG. 5 shows the mounting 12 held in a manner to intercept ambient pressure variations. For instance, the assembly as shown in FIGS. 2 and 3 may be inserted in a forward exposed body portion of a vehicle such as an automobile or in the skin of a missile; it may be mounted in a tank or pipeline to increase the relatively static as well as dynamic pressure of liquids standing quiescently or flowing therein.

Wires 20 and 22 may pass to any voltage or current responsive device which may be a voltmeter or galvinometer, comprising an indicator arm 56 mounted upon a dial face 58, whereby the indicator arm 56 ranges itself in various radial directions pointing to the various positions on face 58, variable with the current generated across lines 20 and 22 by the variable pressure applied to the upper surface A of the crystal 14. The various calibrations of the dial 58 can be modified to read in actual wind whose variations in speed and consequent pressure impart different pressures on the exposed surface A of the crystal 14 to thereby provide a speedometer useful for automobiles or missiles. Obviously the device will operate for static pressures or confined in tanks by moving fluid pressures in a pipe. While the dial markings 58 may be calibrated to read in wind velocities, they may be calibrated in any other variables as in ground speeds of a plane or an automobile; or they can be calibrated to read in absolute pressure, such as high or low vacuumized pressures.

Figure 6:
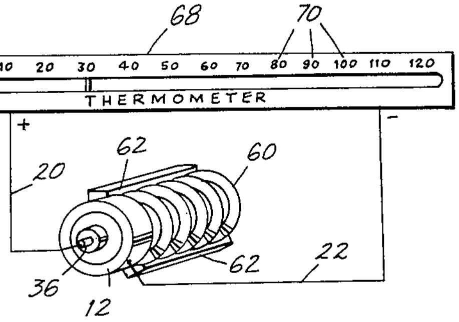
FIG. 6 illustrates a combination of the crystal with temperature expandible bellows to measure temperature.

FIG. 6 shows another modification in which the device is used to measure variable temperatures. For this purpose the crystal holder 12 supports a bellows element 60 which is free to expand or contract with ambient temperature of any medium in which the device is placed. Two yoke-like arms rigidly fasten the outer end 64 of the bellows to the crystal housing 12. As thus supported, the free inner end 66 of the bellows is free to expand or contract toward or away from the exposed crystal face A of the piezo crystal mounted and constructed as in FIG. 3. Since the bellows outer end 64 is held fixedly by the yoke arms 62, any expansion or contraction of the gas in the bellows with tempearture variaitons causes the inner bellows end to bear with a pressure of greater or less degree against the face A of crystal 14. Thus, as the ambient temperature surrounding the bellows 60 varies, it causes greater or lesser pressure to be imparted to the crystal. Consequently, the electrical output of the crystal is caused to vary with temperature. Any suitable electrical indicating device 68 having a dial indicator movable responsive to the electrical output of the crystal will record temperature when the dial markings 70 are calibrated to read in temperature degrees. While a horizontally traversing needle is shown in this figure according to known electrical indicator construction, any electrically responsive indicator such as the dial 54 of FIG. 5 calibrated to read in temperature degrees, could be substituted.

Figure 7:
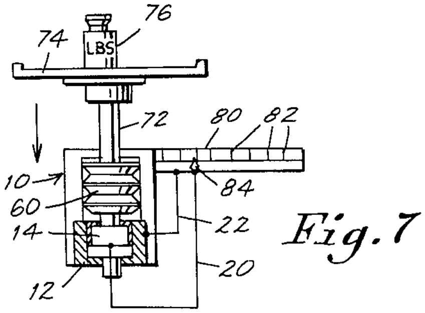
FIG. 7 illustrates the use of the crystal to measure weight.

FIG. 7 is a modification similar to FIG. 6 except that a bellows 60 or other pressure transfer element is mounted vertically to transfer pressure downward in the direction of the arrow against the face A of crystal 14 supported calibratedly under pressure as described above in a mounting 12 so that the downward pressure of any force transferring element 72, which is shown here as merely a vertical rod, resiliently bears against the face of the crystal A. The bellows 60 in this instance, can be replaced with a spring, or other resilient member can transfer pressures to the face of the crystal accurately, but without damage. A pan 74 of a scale may be mounted normal to the rod 72 to receive various weight elements 76 thereon. The variable weights in terms of various gravity pressures applied to the crystal 14 will vary its output through conductors 20 and 22. These are hooked up to any electrical measuring device 80 having a dial 84 which will indicate on the scale 82 the quality of the current and/or voltage generated by the crystal 14, responsive to weight or pressure applied to the crystal, such weight applied by way of arm 72; that is, any variation of the weight 76 will cause the electrical indicator 84 to assume a corresponding position on the calibrated dial markings 82 to read in terms of weight. Accordingly, to adopt the electrical crystal element hereof to a scale to measure weights, it is necessary only to calibrate the markings 82 to correspond to pounds, ounces or grams, whichever is to be measured. Other electroresponsive units such as 68 of FIG. 6, or 54 of FIG. 5, suitably calibrated to elements of weight could be used instead of the indicator 80.

Figure 8:
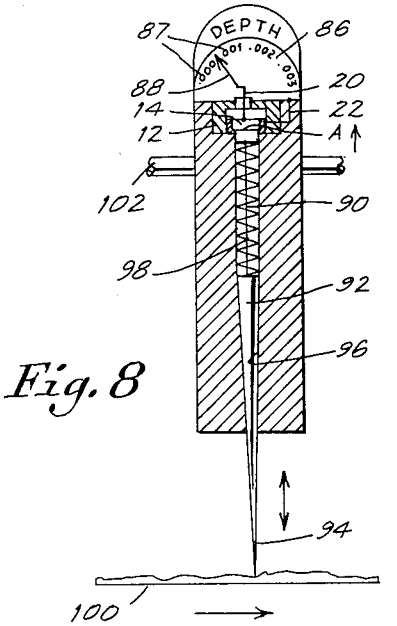
FIG. 8 illustrates the use of th e crystal as a depth gauge to measure dimension irregularities.

FIG. 8 shows a device for measuring thickness or depth irregularities as a further modified application of the crystal mount. A holder 10 has the crystal housing 12 set therein with the face A of the crystal 14 directed downward. The pressure on the crystal is pre-set to a zero reading indicated on a standard dial face 86. An indicator arm 88 is positioned on the dial 86 in various positions electrically responsive to the pressure conditions on the face A of crystal 14, and transmitted by the electrical leads 20 and 22 as described in other modifications, FIGS. 5, 6, and 7. The electrical indicating dial 86 and needle 88 positions are calibrated to vary accurately with the electrical conditions being transmitted through leads. A vertical transmission arm 90 comprising a rod resiliently bearing at one end against the crystal face A and at the other upon the upper end of needle 92. The needle 92 is tapered at one end 94 held vertically slidably in a tapered slot 96 in the lower end of the mount 12 and resiliently urges the rod-like arm 90 and needle 92 outwardly away from the face A of the crystal 14. In operation, any device 100 whose thickness is to be measured is passed normal to the needle 92 in the direction of the arrow and the device is mechanically mounted as shown or is held by manual gripping handles or ears 102 in the position as shown; that is the needle is held normal to the direction of passage of the element 100. That element 100 may be any device whose thickness it to be measured as illustrated. As the device 100 moves in the direction of the arrow the needle 92 in contact therewith is displaced upward and returned downward by the spring 98 as shown, responsive to any irregularities in the surface 100. The needle 92 moving up and down pushes the arm 90 in contact with the surface A of crystal 14 to bear with greater or lesser pressure thereon, such pressure variations corresponding to thickness variations of element 100 and which are converted by the crystal to corresponding variations of electrical conditions of the crystal which are transferred by electrical conductor wires 20 and 22 to properly position indicator arm 88 with respect to dial 86, indicating electrically the thickness condition of element 100 as it passes beneath the needle. In this instance, or course, the dial numbers 87 will be positioned to correspond to linear dimensional variations of the surface irregularities of the material to be measured. In this manner, an accurate depth or thickness gauge is provided.

Figure 9:
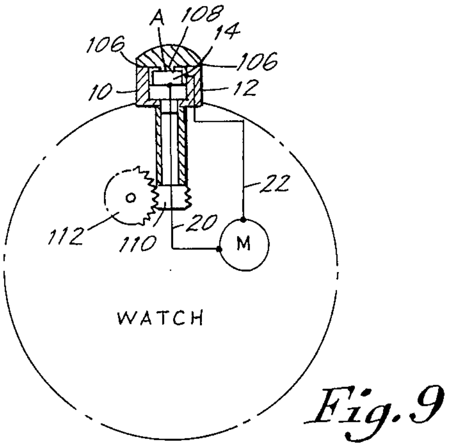
FIG. 9 illustrates mounting of the crystal to use its electrical output to operate a watch.

The variation of electrical output with pressure on the crystal using the mount herein described, can be used as a source of electrical energy to provide motive power for extremely weak mechanical devices requiring very little electrical energy for motivation such at a watch, clock or other electrical indicating machine or device. For this purpose FIG. 9 illustrates a watch having a minute electrical motor M whose power is derived through electrical leads 20 and 22 which conduct electrical energy generated through the crystal 14 mounted in the stem of a watch in the manner shown in FIG. 3. The motor M is also connected for conventional drive to watch gears for operation as a time piece. To provide this source of energy to activate the crystal, a pressure transfer knob 104 is secured by pins 106 to reciprocate above and coaxially with the crystal mount 12. The pressure transfer knob 104 has a boss depending from its center and ajusted to bear downward in contact with the upper surface A of the crystal 14. As thus assembled, any pressure, even ambient pressure or pressure derived by the movement of a watch by the user, will cause a pressure variation upon the surface A of the crystal 14 which is transferred thereto by the boss 108, thus generating current in lines 20 and 22 to provide power for the motor M. In conventional watch construction, watch stem 10 which might hold the crystal mount 12 can also carry the inner gear 110 meshing with gears 112 for presetting of the watch for use. While in FIGS. 4 through 8 above, indicia comprising the entire phase are calibratedly marked with significant regulated and continuous measurement, fewer markings can be substituted such as maxima and minima positions or areas of both—"higher," "lower" or "medium" as would be useful for measurement in a particular problem or surface.

As thus described, an improved piezo crystal mount is provided which has by torque adjustment a preset pressure of crystal contacts upon the crystal, thereby providing adjustably firm controlled pressure of the electrical contacts upon the crystal. No inaccuracies develop upon the use of this crystal due to stresses upon the crystal contacts. At the same time, the absolute pressure and output of the crystal is adjustably set. This type of mount lends itself to numerous uses requiring an accurately preset pressure, electrical output conditions of the crystal such as to measure ambient pressures or consequent velocity pressures thereby being useful to measure pressure or velocity on stationary or moving bodies. It is useful to measure temperatures, weights, linear thickness or distances to produce an accurately calibrated current for measuring electrical conditions of other electrical devices or to provide minute power requirements of delicate instruments.

This application is a division of my copending application Serial No. 52,492, filed August 30, 1960.

I claim:

1. A piezoelectric crystal mount comprising a conductive housing securing and supporting a piezoelectric crystal with one surface of the crystal body pressure-responsively exposed, a non-conductive contact support having an electrical contact integrally secured in the body thereof, said contact being of relatively small surface area with respect to said crystal in surface to surface contact to avoid interference by the contact with the vibrational surface characteristics of the crystal, said contact support being adjustably fastenable to press against the opposite surface of said crystal with its electrical contact insulated from said conductive housing and bearing in electroconductive contact against the said opposite surface of said crystal.

2. The crystal mount as defined in claim 1 wherein both the housing and non-conductive contact support are each threaded matingly with the other whereby the contact and pressure thereof against the crystal surface are adjusted by rotary torque pressure developed between said mating threads.

3. The crystal mount as defined in claim 1 wherein both the housing and non-conductive contact support are each threaded matingly with the other and wherein the non-conductive contact support has an annular boss extending below said threaded portion which may be grasped as a handle member for rotary adjustment of its position and consequent contact pressure against the crystal in threaded engagement with said housing.

4. The crystal mount as defined in claim 1 in which the conductive housing comprises an annular body having cut axially at least one surface indentation comprising keway splines or the like.

5. A piezoelectric crystal mount comprising an annular electroconductive ring having a downturned flange at one end and threading in the opposite end, a piezo crystal in said housing secured therein at one surface by said end flange with its secured surface substantially exposed pressure-responsively, an annular non-conductive contact support having circumferential threads thereabout sized to mate with the threads in said ring, an axial bore through said contact support, an electric conductor integrally mounted in said axial bore terminating and secured at the opposite contact support surface to an electroconductive contact body, said contact body being of relatively small surface area with respect to said crystal in contact therewith, said contact support being threadedly assembled with said ring and crystal therein with the contact support therein bearing against the opposite surface of said crystal in controlled contact pressure thereagainst by adjustment of the said threaded elements supporting said contact body in the electroconductive contact therewith.

6. The crystal mount as defined in claim 5 in which the non-conductive contact support is an annular body threaded at one end upon its circumferential surface, the unthreaded remainder of said annular body extending outward from the annular mount housing as a handle member which may be grasped for application of rotary torque in threaded adjustment of the contact pressure upon said crystal.

7. A piezo crystal mount comprising a conductive housing securing and electro-conductively contacting the marginal portion of one surface of a piezoelectric crystal while leaving most of the area of said crystal surface pressure-responsively exposed through one end thereof, a non-conductive support body mounted through the opposite end of said housing to adjustably apply pressure against the opposite surface of said crystal, said non-conductive support body having integrally embedded therein an electrical contact member disposed with its contact surface in electroconductive contact with a relatively small portion of said opposite crystal surface and insulated by said support from the conductive portions of said housing.

References Cited in the file of this patent

UNITED STATES PATENTS 2,626,992 Holman ---------------- Jan. 27, 1953